(12) United States Patent
Ko et al.

(10) Patent No.: US 10,163,465 B1
(45) Date of Patent: Dec. 25, 2018

(54) DATA RECEIVER AND CONTROLLER FOR DDR MEMORY

(71) Applicant: NOVATEK Microelectronics Corp., Hsin-Chu (TW)

(72) Inventors: Po-Yao Ko, Kaohsiung (TW); Chien-Chung Chen, Pingtung County (TW); Hsu-Yu Huang, Hsinchu (TW); Chun-Po Huang, Tainan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/680,216

(22) Filed: Aug. 18, 2017

(51) Int. Cl.
  *G11C 8/10* (2006.01)
  *G11C 7/10* (2006.01)
  *H03F 3/30* (2006.01)

(52) U.S. Cl.
  CPC .............. *G11C 7/1006* (2013.01); *G11C 8/10* (2013.01); *H03F 3/3035* (2013.01); *H03F 2200/279* (2013.01)

(58) Field of Classification Search
  CPC .................................. G11C 7/222; G11C 8/10
  USPC ........................................ 365/189.05, 230.06
  See application file for complete search history.

(56) References Cited

U.S. PATENT DOCUMENTS

| | | | | |
|---|---|---|---|---|
| 7,233,184 B1* | 6/2007 | Nguyen | ........... | H03K 3/356156 327/199 |
| 7,659,783 B2* | 2/2010 | Tai | ........... | H03L 1/022 331/108 B |
| 8,159,274 B2* | 4/2012 | Lin | ........... | H04L 7/0008 327/108 |
| 8,305,903 B1* | 11/2012 | Louise | ........... | G06F 15/00 370/241 |
| 8,692,605 B2* | 4/2014 | Jao | ........... | H03K 5/2472 327/309 |
| 8,817,914 B2* | 8/2014 | Shawwa | ........... | H03K 5/1565 327/171 |
| 8,848,810 B2* | 9/2014 | Lee | ........... | H04L 25/49 370/258 |
| 9,755,818 B2* | 9/2017 | Sengoku | ........... | H04L 7/0087 |
| 2002/0170006 A1* | 11/2002 | Schaber | ........... | G01R 31/31727 714/724 |
| 2006/0025089 A1* | 2/2006 | Salcido | ........... | H04L 25/0276 455/127.1 |
| 2006/0244505 A1* | 11/2006 | Fung | ........... | G06F 1/10 327/293 |
| 2009/0059642 A1* | 3/2009 | Ware | ........... | G11C 5/063 365/63 |
| 2011/0063931 A1* | 3/2011 | Linam | ........... | G06F 13/1689 365/193 |
| 2012/0039136 A1* | 2/2012 | Linam | ........... | G11C 7/02 365/189.18 |

(Continued)

*Primary Examiner* — Michael Tran
(74) *Attorney, Agent, or Firm* — Winston Hsu

(57) ABSTRACT

A data receiver for a double data rate (DDR) memory includes a first stage circuit and a second stage circuit. The first stage circuit is deployed for receiving a single-ended signal from the DDR memory and converting the single-ended signal into a pair of differential signals. The second stage circuit, coupled to the first stage circuit, is deployed for receiving the differential signals from the first stage circuit and converting the differential signals into an output signal. Both of the first stage circuit and the second stage circuit are implemented in a core voltage domain.

21 Claims, 3 Drawing Sheets

(56) References Cited

U.S. PATENT DOCUMENTS

| | | | | |
|---|---|---|---|---|
| 2012/0194273 A1* | 8/2012 | Chuang | ............... | H03F 1/0261 |
| | | | | 330/253 |
| 2012/0269296 A1* | 10/2012 | Chuang | ............... | G11C 7/1084 |
| | | | | 375/316 |
| 2013/0058175 A1* | 3/2013 | Lin | ............... | G11C 7/1045 |
| | | | | 365/193 |
| 2015/0364212 A1* | 12/2015 | Razzaz | ............... | G11C 29/023 |
| | | | | 365/193 |
| 2017/0288683 A1* | 10/2017 | Wei | ............... | H03L 7/0814 |
| 2018/0039598 A1* | 2/2018 | Mishra | ............... | G06F 13/364 |

\* cited by examiner

US 10,163,465 B1

DATA RECEIVER AND CONTROLLER FOR DDR MEMORY

BACKGROUND OF THE INVENTION

1. Field of the Invention

The present invention relates to a data receiver and controller for a double data rate (DDR) memory, and more particularly, to a data receiver and controller applicable to every generation of DDR memories.

2. Description of the Prior Art

In normal memories, read and write operations take place only on the rising or falling edge of a clock signal, but data in double data rate (DDR) memories are read and written both on rising edges and falling edges of the clock signal. Accordingly, DDR memories can provide doubled data throughput compared to the single data rate memories. So far there are four generations of DDR memories available in the market, including DDR1, DDR2, DDR3 and DDR4. According to the specifications of the DDR memories, different generations of DDR memories have different operating voltages, such that different signal swings possess in the data interface of different generations of DDR memories. For example, the signal level "High" in DDR1 equals 2.5V, in DDR2 equals 1.8V, in DDR3 equals 1.5V, and in DDR4 equals 1.2V.

Since the signal swings are different in different generations of DDR memories, different types or structures of data receivers have been developed. However, in the conventional data receiver, a higher power supply voltage (e.g., the I/O voltage) is applied in the input stage circuit, in order to receive the data signal from the DDR memory, where the signal swing of the DDR memory should be within the domain of the I/O voltage. The data signal is then transmitted to the core voltage domain, where two power supplies (the I/O voltage and the core voltage) are necessary in the data receiver, and the usage of I/O voltage requires more power. Further, the conventional data receivers are adaptive to at most one or two of the DDR generations since the signal swings of different DDR generations are different. Thus, there is a need to provide a novel data receiver which is adaptive to every generation of DDR memories and also has the benefits of less power consumption.

SUMMARY OF THE INVENTION

It is therefore an objective of the present invention to provide a data receiver and controller applicable to every generation of double data rate (DDR) memories, in order to solve the above problem.

An embodiment of the present invention discloses a data receiver for a DDR memory. The data receiver comprises a first stage circuit and a second stage circuit. The first stage circuit is deployed for receiving a single-ended signal from the DDR memory and converting the single-ended signal into a pair of differential signals. The second stage circuit, coupled to the first stage circuit, is deployed for receiving the differential signals from the first stage circuit and converting the differential signals into an output signal. The first stage circuit and the second stage circuit are implemented in a core voltage domain.

An embodiment of the present invention further discloses a controller for a DDR memory. The controller comprises a data transmitter and a data receiver. The data receiver comprises a first stage circuit and a second stage circuit. The first stage circuit is deployed for receiving a single-ended signal from the DDR memory and converting the single-ended signal into a pair of differential signals. The second stage circuit, coupled to the first stage circuit, is deployed for receiving the differential signals from the first stage circuit and converting the differential signals into an output signal. The first stage circuit and the second stage circuit are implemented in a core voltage domain.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
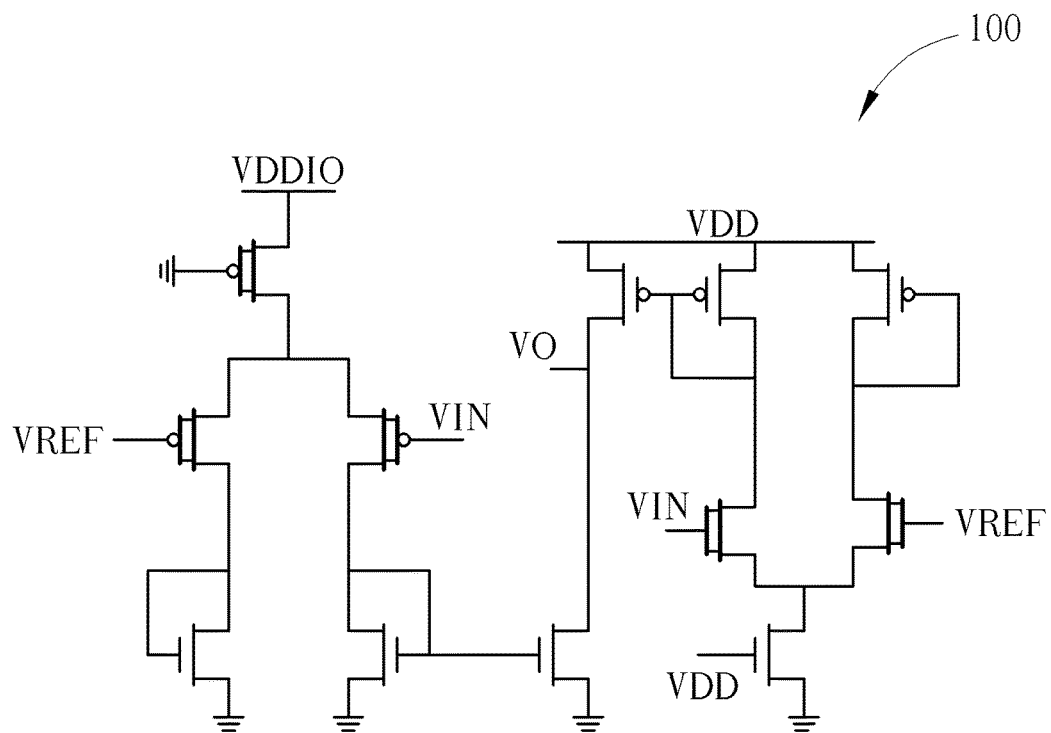
FIG. 1 is a schematic diagram of a conventional data receiver for a DDR2 memory.

Please refer to FIG. 1, which is a schematic diagram of a conventional data receiver 100 for a DDR2 memory. The data receiver 100 receives an input signal VIN from the DDR2 memory and generates an output signal VO accordingly. A reference voltage VREF between the signal levels "High" and "Low" is received as a reference. The input stage receives an input/output (I/O) voltage VDDIO as its power supply voltage, and the output stage receives a core voltage VDD as its power supply voltage. Ina semiconductor process, the I/O voltage VDDIO may equal 2.5V and the core voltage VDD may equal 0.9V. In this case, the input stage is applicable to receive the input signal swing of the DDR2 memory, i.e., a signal swing between voltages 0V and 1.8V.

As shown in FIG. 1, the I/O voltage VDDIO is applied in the input stage circuit, in order to receive the data signal from the DDR memory, where the signal swing of the DDR memory should be within the domain of the I/O voltage VDDIO. Thus, power supplies from both the I/O voltage VDDIO and the core voltage VDD are necessary in the data receiver. In such a situation, two power domains are required in the data receiver 100, where the higher I/O voltage VDDIO may consume more power.

Figure 2:
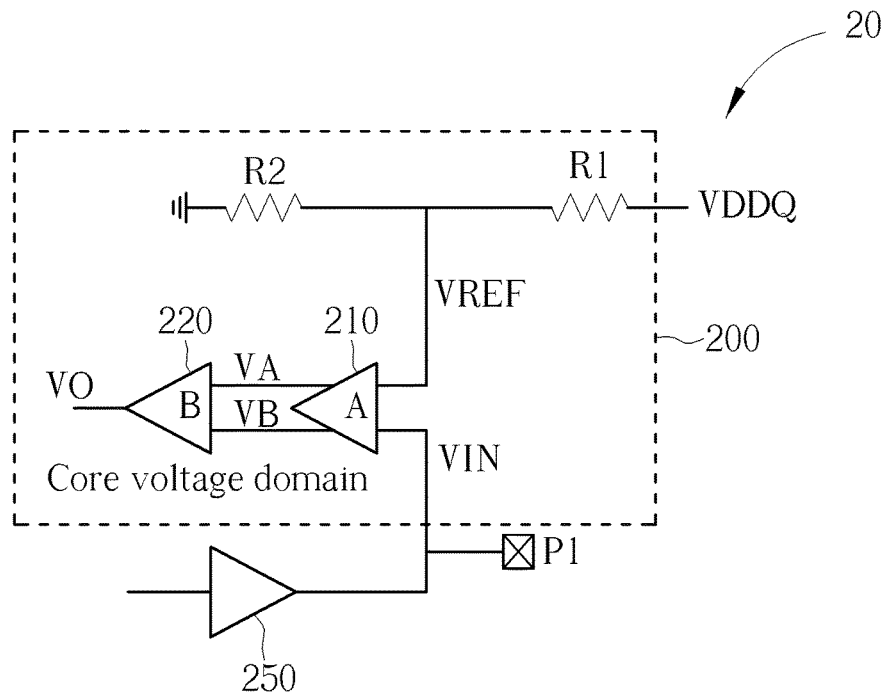
FIG. 2 is a schematic diagram of a controller for a DDR memory according to an embodiment of the present invention.

Please refer to FIG. 2, which is a schematic diagram of a controller 20 for a double data rate (DDR) memory according to an embodiment of the present invention. As shown in FIG. 2, the controller 20 includes a data receiver 200 and a data transmitter 250. The controller 20 is coupled to the DDR memory (not illustrated) via a semiconductor pad P1, and is responsible for handling data transfers of the DDR memory. More specifically, the data receiver 200 is deployed for receiving data from the DDR memory, and the data transmitter 250 is deployed for transmitting data to the DDR memory. Note that the DDR memory may be of any generation; that is, the DDR memory coupled to the controller 20 may be a DDR1, DDR2, DDR3 or DDR4 memory.

In detail, the data receiver 200 includes a first stage circuit 210 and a second stage circuit 220. The first stage circuit 210 is deployed for receiving a single-ended signal VIN from the DDR memory and converting the single-ended signal VIN into a pair of differential signals VA and VB. The second stage circuit 220, which is coupled to the first stage circuit 210, is deployed for receiving the differential signals VA and VB from the first stage circuit 210 and converting the differential signals VA and VB into an output signal VO. Note that in the data receiver 200, both of the first stage circuit 210 and the second stage circuit 220 are implemented in the core voltage domain of a CMOS process. In such a situation, the I/O voltage domain or other additional power supply may be omitted. Different from the conventional data receiver where the data or signals from the DDR memory are received or sensed by circuitry in the I/O voltage domain and then forwarded to the core voltage domain, in the embodiments of the present invention, the data or signals from the DDR memory are directly received or sensed by circuitry in the core voltage domain. In an embodiment, the core voltage may be 0.9V while the signals from the DDR memory range from 0 to 2.5V (i.e., the full signal swing of the DDR1 memory); that is, the data receiver 200 is capable of receiving or sensing a voltage higher than its power supply voltage. In such a situation, the data receiver of the present invention does not need to receive I/O power, and may require less power since the core power supplies a lower voltage.

Please keep referring to FIG. 2. The first stage circuit 210 of the data receiver 200 further receives a reference voltage VREF from termination resistors R1 and R2. The reference voltage VREF may be compared with the single-ended signal VIN to generate the differential signals VA and VB. In general, the DDR memory interface transmits single-ended signals rather than fully differential signals, such that the reference voltage VREF is necessary in the receiving end of the DDR memory interface. Note that the termination resistors R1 and R2 are coupled to the power supply terminal VDDQ of the DDR memory and deployed for generating the reference voltage VREF. In another embodiment, the data receiver 200 may include more than two resistors. Alternatively, the termination resistors R1 and R2 may be replaced by a variable resistor, the termination resistors may be deployed independent of the data receiver, and/or the termination resistors may have other circuit structures. Preferably, the resistance values of the resistors R1 and R2 are equal, allowing the reference voltage VREF to be equal to the middle voltage of the signal levels "High and "Low" of the DDR memory. It should be noted that the deployment of the termination resistor(s) should not be a limitation of the present invention.

Figure 3:
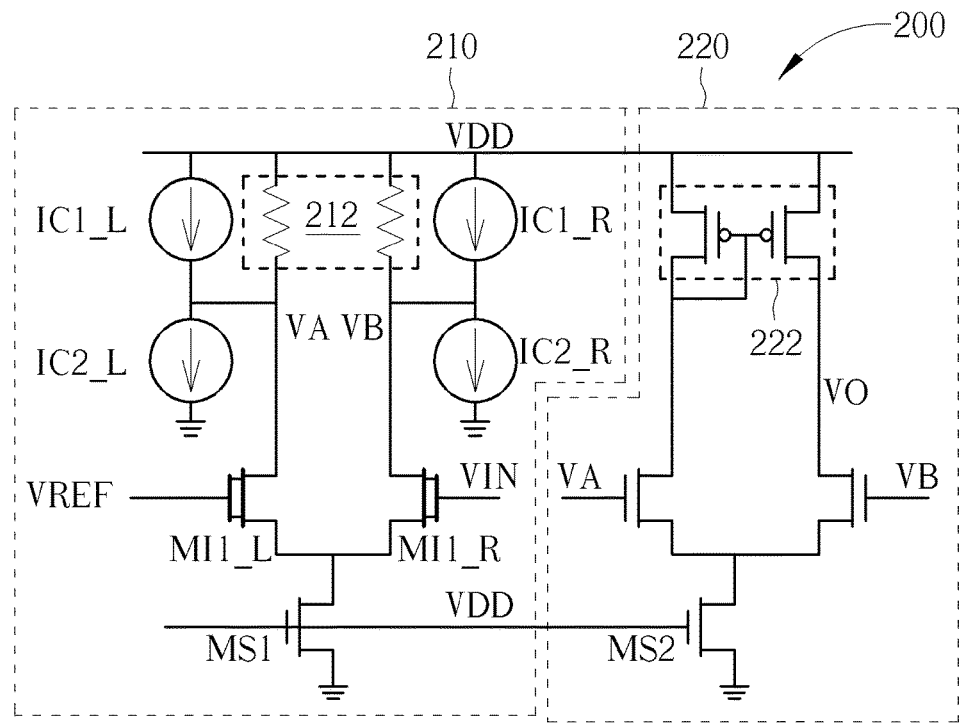
FIG. 3 is a schematic diagram of a detailed implementation of the data receiver.

Please refer to FIG. 3, which is a schematic diagram of a detailed implementation of the data receiver 200. In FIG. 3, both of the first stage circuit 210 and the second stage circuit 220 are implemented in the core voltage domain and receive a core voltage VDD as their power supply voltage. The first stage circuit 210 includes an input differential pair, a switch transistor MS1 and a load unit 212. The second stage circuit 220 includes a differential pair, a switch transistor MS2 and a load unit 222. As shown in FIG. 3, the first stage circuit 210 may be considered as an operational amplifier with single-ended input and differential output, and the second stage circuit 220 may be considered as an operational amplifier with differential input and single-ended output.

In detail, in the first stage circuit 210, the input differential pair includes input transistors MI1_L and MI1_R, where the input transistor MI1_R receives the single-ended signal VIN from the DDR memory, and the input transistor MI1_L receives the reference voltage VREF. In this embodiment, the input transistors MI1_L and MI1_R are NMOS transistors. The switch transistor MS1_, which is coupled to the common source terminal of the input transistors MI1_L and MI1_R, receives the core voltage VDD on its gate terminal and acts as a switch. The load unit 212, which is coupled to the drain terminal of the input transistors MI1_L and MI1_R, acts as a load and provides a resistance for the operational amplifier. In this embodiment, the load unit 212 includes two resistors respectively coupled to the input transistors MI1_L and MI1_R. Note that in another embodiment, the load unit 212 may be implemented with transistors that are connected and behave similar to the resistors to generate equivalent resistance.

Please note that the input differential pair of the first stage circuit 210 receives the single-ended signal VIN from the DDR memory and should be adaptive to full signal swing of any generation of DDR memories. Since the first stage circuit 210 is implemented in the core voltage domain, the input transistor MI1_R is required to receive a voltage higher than the core voltage VDD. Also, the reference voltage VREF received by the input transistor MI1_L is the middle voltage of signal levels "High" and "Low" of the single-ended signal VIN from the DDR memory, and may also be higher than the core voltage VDD, e.g., when the DDR memory is DDR1. In order to solve the reliability issue, the input transistors $MI1_{L\ and\ MI}1\_R$ may be implemented with thick devices, which are capable of receiving a voltage higher than the supply voltage (core voltage domain). The thick devices may be MOS transistors of which the gate oxide is thick, so that the MOS transistors are sustainable to higher gate-source voltage and gate-drain voltage. In an embodiment, the core voltage VDD may equal 0.9V and the controller 20 is applied to a DDR1 memory where the single-ended signal VIN may equal 2.5V; hence, the reference voltage VREF may equal 1.25V. The input transistors MI1_L and MI1_R are implemented with thick devices and have the capability of receiving the 1.25V reference voltage VREF and the 2.5V single-ended signal VIN even if the differential pair in the first stage circuit 210 is operated in the core voltage domain 0.9V.

Since the differential pair may receive a voltage higher than the core voltage VDD with the thick devices, there may not be enough headroom for deployment of a current source in the first stage circuit 210. In an exemplary example, the core voltage equals 0.9V and the single-ended signal VIN equals 2.5V, and the common mode source voltage of the differential pair may approximately equal zero according to the characteristics of the input transistors MI1_L and MI1_R. In such a situation, it is not feasible to deploy a current source on the common source terminal of the differential pair. The switch transistor MS1_may only receive the core voltage VDD, to be implemented as a switch. When the data receiver 200 is powered on, the switch transistor MS1_is turned on to enable the operations of the first stage circuit 210.

Without a current source, the linearity of signal conversion may not be effectively controlled. Therefore, the first stage circuit 210 further includes current sources IC1_L, IC2_L, IC1_R and IC2_R which provide compensation currents for the first stage circuit 210. As shown in FIG. 3, the current sources IC1_L and IC2_L are coupled to the drain terminal of the input transistor MI1_L, and provide a compensation current for the input transistor MI1_L, where the compensation current value equals IC1_L minus IC2_L. The current sources IC1_Rand IC2_Rare coupled to the drain terminal of the input transistor MI1_R, and provide a compensation current for the input transistor MI1_R, where the compensation current value equals IC1_R minus IC2_R. The compensation currents improve the linearity of converting the single-ended signal VIN into the differential signals VA and VB in the first stage circuit 210.

Please note that the compensation current may not only improve the linearity of signal conversion, but also provide auto PVT compensation for the first stage circuit 210. The PVT compensation refers to compensation of the on-chip process, supply voltage and temperature. For example, the current consumption of the differential pair may equal 1mA in a typical case (e.g., the TT corner). If the current consumption of the differential pair increases to 2mA in the FF corner of the process together with a higher supply voltage, the current sources may also provide more currents for the differential pair, so as to compensate the variations on the process and supply voltage. In such a situation, the voltage swing of the differential signals VA and VB may become more stable under the PVT variations. The improvements of linearity and PVT compensation allow the output signal VO of the data receiver 200 to have a duty cycle approaching 50%, where the lengths of a high pulse and a low pulse are approximately equal, in order to meet the requirements for DDR specification and also improve the data rate.

Please keep referring to FIG. 3. After the first stage circuit 210 generates the differential signals VA and VB, the second stage circuit 220 receives the differential signals VA and VB and converts the differential signals VA and VB into the output signal VO. The output signal VO is in the core voltage domain and may undergo follow-up signal processing without additional conversions.

It should be noted that the circuit structure of the data receiver according to embodiments of the present invention is quite simple. The data receiver has a two-stage circuit structure, and both stages are supplied by the core voltage only. The signal from the DDR memory, which may have a voltage higher than the core voltage, is directly received or sensed by a thick device with enough reliability. In such a situation, the signal from the DDR memory does not need to be shifted to a lower voltage level before being converted to the differential signals by the first stage circuit. This implementation prevents the usage of redundant level shifters or level-down circuits, and thereby achieves the simplicity of circuit design in the data receiver and also reduces power consumption and circuit area. In addition, with the usage of thick devices in the first stage circuit of the data receiver, the data receiver is capable of receiving data from the DDR memories in any generations. In other words, the single-ended signal received by the data receiver may comply with the full signal swing of any of the DDR1, DDR2, DDR3 and DDR4 memory. Preferably, the input transistors of the first stage circuit may be NMOS transistors, so as to receive a voltage signal higher than the core voltage.

Please note that the present invention aims at providing a data receiver applicable to every generation of DDR memories. Those skilled in the art may make modifications and alternations accordingly. For example, in the above embodiments, the termination resistors are implemented with a stub series terminated logic (SSTL) structure. In another embodiment, the termination resistor may be implemented with a pseudo open drain (POD) structure. Note that the POD structure is generally applied to the DDR4 memory and the SSTL structure is generally applied to the DDR1, DDR2 and DDR3 memories in conventional DDR controllers. In the present invention, both SSTL and POD structures are feasible.

Figure 4:
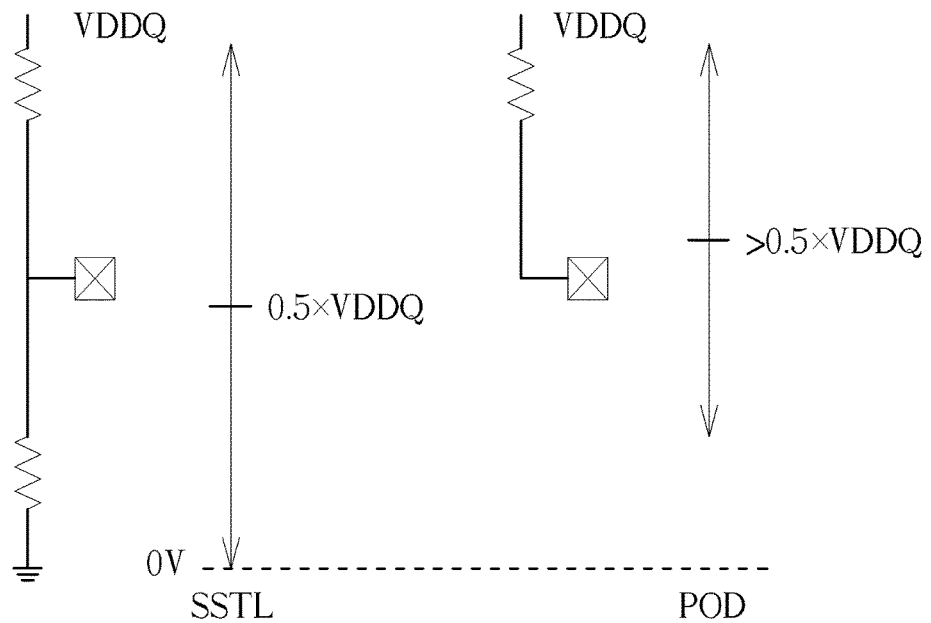
FIG. 4 is a schematic diagram of SSTL and POD structures.

Please refer to FIG. 4, which is a schematic diagram of SSTL and POD structures. As shown in FIG. 4, the SSTL structure includes a high side resistor coupled between the pad and the power supply terminal VDDQ of the DDR memory and a low side resistor coupled between the pad and the ground terminal. In such a situation, the common mode voltage is equal to a half of VDDQ. Also, the reference voltage is generated according to voltage division of the same termination resistor structure, and may also equal a half of VDDQ. On the other hand, the POD structure includes only one resistor coupled between the pad and the power supply terminal VDDQ. In this case, the signal level "High" equals VDDQ, while the signal level "Low" becomes higher than the zero voltage; hence, the common mode voltage and the reference voltage, which equal the middle voltage of signal levels "High and "Low", may be higher than a half of VDDQ.

In the embodiments of the present invention, the POD structure is a preferable solution for the termination resistors; that is, the controller of the present invention used for any generation of DDR memories may apply the POD structure for resistance termination. The POD structure has less direct current (DC) power consumption, since the resistor consumes no power when the signal level is "High", where no current flows through the power supply terminal VDDQ to the pad (with the same voltage VDDQ) . In addition, the POD structure has a higher common mode voltage, which is beneficial to the first stage circuit of the data receiver having an NMOS input differential pair.

Figure 5:
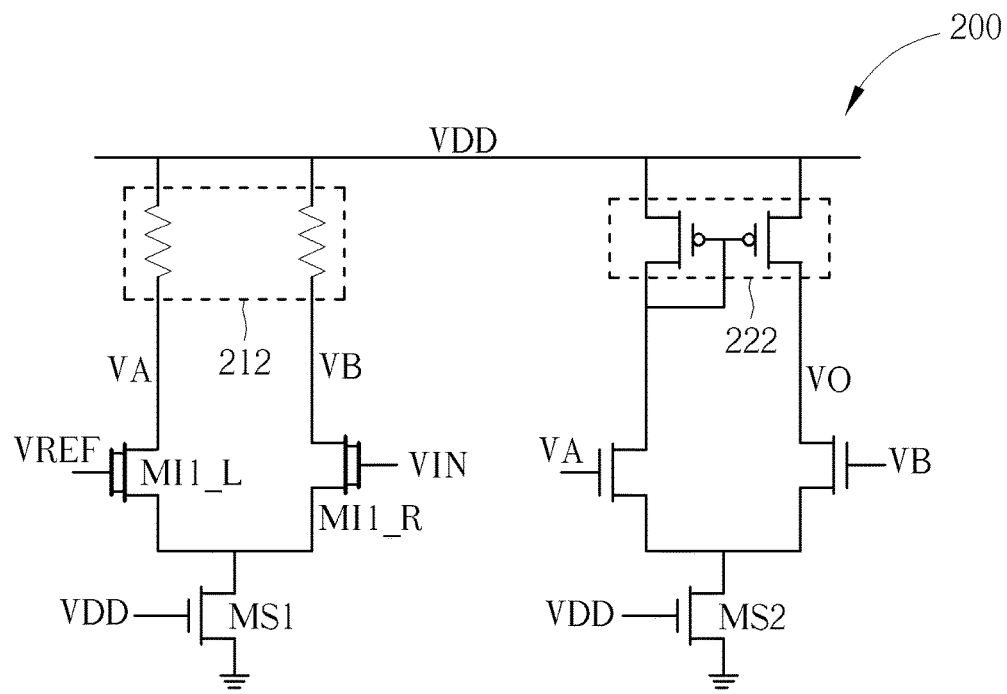
FIG. 5 is a schematic diagram of an implementation of the data receiver shown in FIG. 3.

Please refer to FIG. 5, which is a schematic diagram of an implementation of the data receiver 200 shown in FIG. 3. This embodiment is applicable for DDR2 memory interface with full input signal swing between 0V and 1.8V. The data rate of the DDR2 memory ranges from 400 to 1066 megatransfers per second (MT/s), and the circuit structure without additional current sources is enough to deal with the operational speed. Therefore, the current sources IC1_L, IC2_L, IC1_R and IC2_R shown in FIG. 3 are omitted; in other words, the case shown in FIG. 5 is a special case where the currents provided by these current sources are zero.

Figure 6:
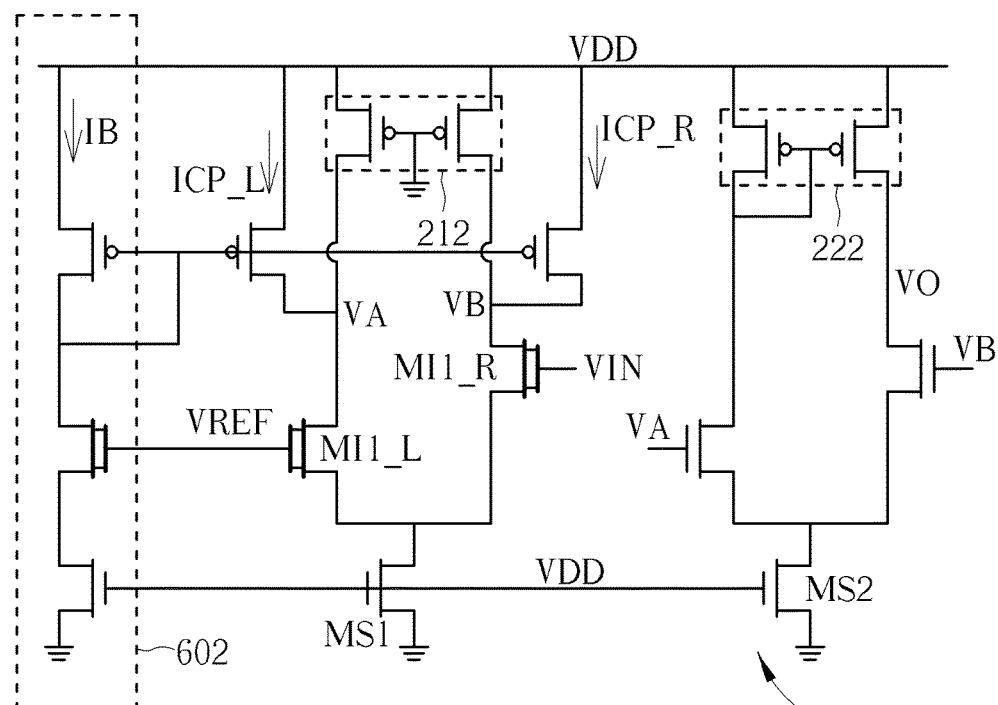
FIG. 6 is a schematic diagram of another implementation of the data receiver shown in FIG. 3.

Please refer to FIG. 6, which is a schematic diagram of another implementation of the data receiver 200 shown in FIG. 3. This embodiment is applicable for DDR4 memory interface with wide input signal swing between 0.4V and 1.2V in the advanced process. Note that the DDR4 memory applies the POD structure for resistance termination, so the signal level "Low" is higher than zero voltage, i.e., 0.4V, where the common mode voltage and the reference voltage VREF are also up to 0.8V. The data rate of the DDR4 memory ranges from 1600 to 2400 MT/s. Since the operational speed of the DDR4 memory is faster, compensation currents are required in the first stage circuit to improve the linearity and duty cycle.

As shown in FIG. 6, the current sources supply compensation currents ICP_L and ICP_R respectively to the drain terminal of the input transistors MI1_L and MI1_R. The data receiver 200 includes a replica bias current source 602, which generates a bias current IB and the bias current IB is mirrored to generate the compensation currents ICP_L and ICP_R. In addition, the replica bias current source 602 may receive the reference voltage VREF and generate the bias current IB from the reference voltage VREF; hence, no additional voltage source or supply voltage is required for generating the compensation currents ICP_L and ICP_R. Since the reference voltage VREF has a fixed voltage value, the value of the bias current IB may be controlled by adjusting the transistor sizes in the replica bias current source 602, and the bias current IB may be mirrored to the compensation currents ICP_L and ICP_R in any ratio. In the case shown in FIG. 6, the currents provided by the current sources IC2_L and IC2_R may be considered to be zero.

To sum up, the present invention provides a data receiver and controller applicable to every generation of DDR memories. The data receiver has a two-stage circuit structure, and both stages are supplied by the core voltage only. By using thick devices as the input transistors, the first stage circuit is able to receive a wide range of signal swing, including full signal swing of any generation of DDR memories. The thick devices ensure the reliability of the circuitry under the signal swing. In addition, compensation currents are supplied for the input differential pair in the first stage circuit, to improve the linearity of signal conversion and also provide auto PVT compensation. According to embodiments of the present invention, the data receiver and related controller are adaptive to every generation of DDR memories, and also have the benefits of simple circuit structure and less power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data receiver for a double data rate (DDR) memory, comprising:
    a first stage circuit, for receiving a single-ended signal from the DDR memory and converting the single-ended signal into a pair of differential signals; and
    a second stage circuit, coupled to the first stage circuit, for receiving the differential signals from the first stage circuit and converting the differential signals into an output signal;
    wherein the first stage circuit and the second stage circuit are implemented in a core voltage domain, and the single-ended signal received by the first stage circuit exceeds the core voltage domain.

2. The data receiver of claim 1, wherein the first stage circuit further receives a reference voltage, which is compared with the single-ended signal to generate the differential signals.

3. The data receiver of claim 2, further comprising at least one termination resistor, coupled to the first stage circuit, for generating the reference voltage.

4. The data receiver of claim 1, wherein the first stage circuit receives a compensation current to improve the linearity of converting the single-ended signal into the differential signals.

5. The data receiver of claim 1, wherein the first stage circuit comprises:
    an input differential pair, comprising:
        a first input transistor, for receiving the single-ended signal; and
        a second input transistor, for receiving a reference voltage;
    a switch transistor, coupled to the common source terminal of the first input transistor and the second input transistor; and
    a load unit, coupled to the drain terminal of the first input transistor and the second input transistor, for providing a resistance.

6. The data receiver of claim 5, wherein the load unit comprises a resistor or a transistor for generating the resistance.

7. The data receiver of claim 5, wherein the first stage circuit further comprises:
    two current sources, each coupled to one of the first input transistor and the second input transistor, for outputting a compensation current to one of the first input transistor and the second input transistor.

8. The data receiver of claim 7, wherein the compensation current is generated from a bias current, which is generated from the reference voltage.

9. The data receiver of claim 5, wherein the first input transistor and the second input transistor are thick devices capable of receiving a voltage higher than the core voltage domain.

10. The data receiver of claim 1, wherein the first stage circuit directly receives the single-ended signal without shifting a voltage level of the single-ended signal before converting the single-ended signal into the differential signals.

11. A controller for a double data rate (DDR) memory, comprising:
    a data transmitter; and
    a data receiver, comprising:
        a first stage circuit, for receiving a single-ended signal from the DDR memory and converting the single-ended signal into a pair of differential signals; and
        a second stage circuit, coupled to the first stage circuit, for receiving the differential signals from the first stage circuit and converting the differential signals into an output signal;
        wherein the first stage circuit and the second stage circuit are implemented in a core voltage domain, and the single-ended signal received by the first stage circuit exceeds the core voltage domain.

12. The controller of claim 11, wherein the first stage circuit further receives a reference voltage, which is compared with the single-ended signal to generate the differential signals.

13. The controller of claim 12, wherein the data receiver further comprises at least one termination resistor, coupled to the first stage circuit, for generating the reference voltage.

14. The controller of claim 11, wherein the first stage circuit receives a compensation current to improve the linearity of converting the single-ended signal into the differential signals.

15. The controller of claim 11, wherein the first stage circuit comprises:
    an input differential pair, comprising:
        a first input transistor, for receiving the single-ended signal; and
        a second input transistor, for receiving a reference voltage;
    a switch transistor, coupled to the common source terminal of the first input transistor and the second input transistor; and
    a load unit, coupled to the drain terminal of the first input transistor and the second input transistor, for providing a resistance.

16. The controller of claim 15, wherein the load unit comprises a resistor or a transistor for generating the resistance.

17. The controller of claim 15, wherein the first stage circuit further comprises:
    two current sources, each coupled to one of the first input transistor and the second input transistor, for outputting a compensation current to one of the first input transistor and the second input transistor.

18. The controller of claim 17, wherein the compensation current is generated from a bias current, which is generated from the reference voltage.

19. The controller of claim 15, wherein the first input transistor and the second input transistor are thick devices capable of receiving a voltage higher than the core voltage domain.

20. The controller of claim 11, wherein the first stage circuit directly receives the single-ended signal without shifting a voltage level of the single-ended signal before converting the single-ended signal into the differential signals.

21. A data receiver for a double data rate (DDR) memory, comprising:
- a first stage circuit, configured to receive a single-ended signal from the DDR memory and convert the single-ended signal into a pair of differential signals; and
- a second stage circuit, coupled to the first stage circuit and configured to receive the differential signals from the first stage circuit and convert the differential signals into an output signal;
- wherein the first stage circuit is configured to operate in a core voltage domain, and the single-ended signal exceeds the core voltage domain.

* * * * *